(12) United States Patent
Matero et al.

(10) Patent No.: US 9,023,427 B2
(45) Date of Patent: May 5, 2015

(54) METHODS FOR FORMING MULTI-COMPONENT THIN FILMS

(75) Inventors: Raija Matero, Helsinki (FI); Tom Blomberg, Vantaa (FI)

(73) Assignee: ASM IP Holding B.V. (NL)

( * ) Notice: Subject to any disclaimer, the term of this patent is extended or adjusted under 35 U.S.C. 154(b) by 0 days.

(21) Appl. No.: 13/472,517

(22) Filed: May 16, 2012

(65) Prior Publication Data

US 2013/0309417 A1 Nov. 21, 2013

(51) Int. Cl.
*C23C 16/40* (2006.01)
*C23C 16/455* (2006.01)

(52) U.S. Cl.
CPC .............. *C23C 16/40* (2013.01); *C23C 16/409* (2013.01); *C23C 16/45529* (2013.01); *C23C 16/45531* (2013.01)

(58) Field of Classification Search
USPC ................. 427/255.29, 255.31, 255.32, 576; 118/88, 92; 117/88, 92
See application file for complete search history.

(56) References Cited

U.S. PATENT DOCUMENTS

| | | | | |
|---|---|---|---|---|
| 5,972,430 | A * | 10/1999 | DiMeo et al. | 427/255.32 |
| 7,108,747 | B1 | 9/2006 | Leskela et al. | |
| 7,713,584 | B2 | 5/2010 | Hatanpaa et al. | |
| 2004/0065253 | A1* | 4/2004 | Tois et al. | 117/84 |
| 2005/0020060 | A1* | 1/2005 | Aaltonen et al. | 438/650 |
| 2006/0088660 | A1 | 4/2006 | Putkonen et al. | |
| 2006/0219157 | A1* | 10/2006 | Rahtu et al. | 117/4 |
| 2008/0048225 | A1* | 2/2008 | Ahn et al. | 257/295 |
| 2008/0072819 | A1* | 3/2008 | Rahtu et al. | 117/104 |
| 2009/0297696 | A1* | 12/2009 | Pore et al. | 427/79 |
| 2011/0065237 | A1* | 3/2011 | Bennahmias et al. | 438/104 |
| 2011/0104906 | A1* | 5/2011 | Tois et al. | 438/762 |
| 2011/0207283 | A1* | 8/2011 | Haukka et al. | 438/381 |
| 2011/0293830 | A1* | 12/2011 | Hatanpaa et al. | 427/255.7 |
| 2013/0034947 | A1* | 2/2013 | Hong et al. | 438/384 |
| 2013/0095664 | A1* | 4/2013 | Matero et al. | 438/703 |
| 2013/0108877 | A1* | 5/2013 | Blomberg | 428/457 |

FOREIGN PATENT DOCUMENTS

WO    WO 2010/144730    * 12/2010

OTHER PUBLICATIONS

Vehkamaki, Marko, et al., "Atomic Layer Deposition of SrTiO3 Thin Films from a Novel Strontium Precursor-Strontium-bis(tri-isopropylcyclopentadienyl". Chemical Vapor Deposition, 2001, 7, No. 2, pp. 75-80.*
Choi, Woon-Seop, "Preparation of Zinc-tin-oxide Thin Films by Using an Atomic Layer Deposition Methodology". Journal of the Korean Physical Society, vol. 57, No. 6, Dec. 2010, pp. 1472-1476.*
Vehkamaki, Marko, "Atomic Layer Deposition of Multicomponent Oxide Materials". Academic Dissertation, Helsinki, Dec. 2007, pp. 1-69.*
Kim, Jin-Hyock, et al., "Film growth model of atomic layer deposition for multicomponent thin films". Journal of Applied Physics, 97, 093505 (2005), pp. 1-5.*
Hausmann, Dennis M., et al., "Atomic Layer Deposition of Hafnium and Zirconium Oxides Using Metal Amide Precursors". Chem. Mater. vol. 14, No. 10, 2002, 4350-4358.*
Leskela, Markku, et al., "Atomic layer deposition (ALD): from precursors to thin film structures". Thin Solid Films 409 (2002) 138-146.*
Devi, Anjana, et al., "Atomic layer deposition (ALD) of complex oxide thin films for integration into semiconductor devices: Precursor engineering and process optimization". DFG Gepris—Projektansicht: (drucken), 2009, pp. 1-2.*
Prof. M. Ritala and Prof. M. Leskela in a recent review article, Handbook of Thin Film Materials, vol. 1: Deposition and Processing of Thin Films, Chapter 2 "Atomic Layer Deposition", pp. 103-159, Academic Press 2002.
T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994.

* cited by examiner

*Primary Examiner* — Bret Chen
(74) *Attorney, Agent, or Firm* — Seppo Laine Oy

(57) ABSTRACT

Atomic layer deposition of multi-component, preferably multi-component oxide, thin films. Provide herein is a method for depositing a multi-component oxide film by, for example, an ALD or PEALD process, wherein the process comprises at least two individual metal oxide deposition cycles. The method provided herein has particular advantages in producing multi-component oxide films having superior uniformity. A method is presented, for example, including depositing multi-component oxide films comprising components A–B–O by ALD comprising mixing two individual metal oxides deposition cycles A+O and B+O, wherein the subcycle order is selected in such way that as few as possible consecutive deposition subcycles for A+O or B+O are performed.

20 Claims, 2 Drawing Sheets

METHODS FOR FORMING MULTI-COMPONENT THIN FILMS

FIELD OF THE INVENTION

The present application relates generally to atomic layer deposition of multi-component, preferably multi-component oxide, thin films.

BACKGROUND OF THE INVENTION

With the scale down of devices, deposition of dielectric films with good step coverage is desirable. Traditional ALD is a self-limiting process, whereby alternated pulses of reaction precursors saturate a substrate surface and leave no more than one monolayer of material per pulse. The deposition conditions and precursors are selected to ensure self-saturating reactions, such that an adsorbed layer in one pulse leaves a surface termination that is non-reactive with the additional gas phase reactants of the same pulse. A subsequent pulse of different reactants reacts with the previous termination to enable continued deposition. Thus each cycle of alternated pulses leaves no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

As described herein, Atomic Layer Deposition (ALD) processes can be used to deposit multi-component thin films. ALD provides good step coverage on three-dimensional structures. Deposition of multi-component thin films are described, for example, in U.S. Pat. Nos. 7,108,747, 7,713,584, U.S. Patent Application Nos. 20060088660 and 20080072819, the disclosures of which all are incorporated herein by reference.

When depositing a multi-component oxide thin film having components A and B using an ALD process, it is common to require uneven cycles of each component to generate a desired thin film. For example, in order to create an SrTiOx thin film from SrO and $TiO_2$ it may be desirable, or necessary, to generate the thin film using a pulse ratio of 3 SrO precursor pulses to every 2 $TiO_2$ precursor pulses.

According to current ALD manufacturing processes, in order to generate such a thin film requiring the 3:2, SrO to $TiO_2$ ratio, three cycles of SrO would be followed by 2 pulses of $TiO_2$. That set of five pulses is then repeated as many times as necessary to generate a thin film having the desired characteristics. Such manufacturing processes however develop thin films having undesirable thickness or composition uniformity.

As technology advances, and reduces in size, the importance of the uniformity of multi-component oxide thin films increases. Therefore, there exists a need for a process by which to produce desired multi-component oxide thin films utilizing uneven ratios of component precursors in the manufacturing process which produces thin films having superior uniformity.

SUMMARY OF THE INVENTION

It is an object of the present invention to provide a method for depositing a multi-component oxide film by an ALD process.

It is an aspect of certain embodiments of the present invention to provide a method for depositing multi-component oxide films comprising components A-B-O by ALD comprising mixing two individual metal oxides deposition cycles A+O and B+O, wherein the subcycle order is selected in such way that as few as possible consecutive deposition subcycles for A+O or B+O are performed.

Additionally, it is an aspect of certain embodiments of the present invention to provide a method for depositing a multi-component oxide film by an ALD process, wherein the method is for a multi-component oxide film having components A-B-O, wherein A is a first metal precursor, B is a second metal precursor, more specifically where the second precursor is distinct from the first, and O is an oxygen source material, and where the method for depositing the multi-component oxide film includes depositing an uneven simplified ratio of X(A+O) to Y(B+O) metal oxide deposition cycles. The method according to such embodiments comprises the steps of; pulsing (A+O) followed by (B+O) the lesser of X and Y times, and pulsing the remaining number of first or second metal oxide deposition cycles before and/or after one or more of said (A+O) and (B+O) pairs such that neither the first nor the second metal oxide deposition cycle is repeated more than |X−Y| times. The plurality of first and second metal oxide deposition cycles X+Y equals a single total deposition cycle and the method may further comprise the step of depositing a plurality of total deposition cycles until a multi-component oxide film having a desired thickness is produced.

It is an aspect of certain embodiments of the present invention to provide a method for depositing multi-component oxide films comprising A-B-O by ALD comprising mixing two individual metal oxides deposition cycles A+O and B+O wherein thorough mixing of A+O and B+O deposition cycles is performed by doing 1:1 [(A+O):(B+O)] subcycles as much as possible and then adding the needed amount additional subcycles A+O or B+O wherever inside the total deposition cycle to achieve the total desired total cycling ratio.

Still yet, it is an aspect of certain embodiments of the present invention to provide a method for depositing multi-component oxide films comprising A-B-O by ALD comprising mixing two individual metal oxides deposition cycles A+O and B+O: n×[x×(A+O)+y×(B+O)], wherein n is total number of cycles, x is number of subcycles for first metal oxide film, y is number of subcycles for second metal oxide film, A is first metal precursor, O is oxygen precursor and B is second metal precursor, wherein both x and y are more than 2, cycles for total cycling ratio x:y of deposition process is broke down to smaller subcycles: n×{k×[(A+O)+(B+O)]+[m×(A+O)]+[w×(B+O)]}, wherein n is total number of cycles, k is number of subcycles with 1:1 ratio, for example to achieve through mixing, m is number of additional subcycles for first metal oxide film, w is number of additional subcycles for second metal oxide film, A is first metal precursor, O is oxygen precursor and B is second metal precursor and wherein the selected total cycling ratio x:y is achieved by choosing x=k+m and y=k+w.

DETAILED DESCRIPTION OF EXEMPLARY EMBODIMENTS

Figure 1:
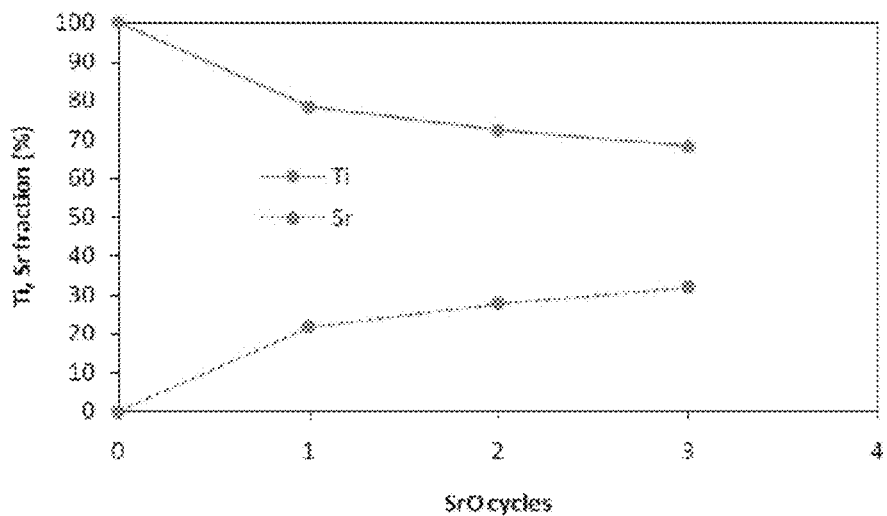
FIG. 1 shows a graph of multiple SrO deposition cycles repeated on a $TiO_2$ starting surface. Ti (solid line) and Sr (dashed line) surface fraction % for growth of SrO on 100 cycles of $TiO_2$ is graphed.

In context of the present invention, "an ALD type process" generally refers to a process for depositing thin films on a substrate molecular layer by molecular layer. This controlled deposition is made possible by self-saturating chemical reactions on the substrate surface. Gaseous reactants are conducted alternately and sequentially into a reaction chamber and contacted with a substrate located in the chamber to provide a surface reaction. Typically, a pulse of a first reactant is provided to the reaction chamber where it chemisorbs to the substrate surface in a self-limiting manner. Excess first reactant is then removed and a pulse of a second reactant is provided to the reaction chamber. The second reactant reacts with the adsorbed first reactant, also in a self-limiting manner. Excess second reactant and reaction by-products, if any, are removed from the reaction chamber. Additional reactants may be supplied in each ALD cycle, depending on the composition of the thin film being deposited.

The pressure and the temperature of the reaction chamber are adjusted to a range where multimonolayer physisorption (i.e. condensation of gases) and thermal decomposition of the precursors are avoided. Consequently, only up to one monolayer (i.e. an atomic layer or a molecular layer) of material is deposited at a time during each pulsing cycle. The actual growth rate of the thin film, which is typically presented as Å/pulsing cycle, depends, for example, on the number of available reactive surface sites on the surface and bulkiness of the reactant molecules.

Gas phase reactions between precursors and any undesired reactions with by-products are preferably inhibited or prevented. Reactant pulses are separated from each other and the reaction chamber is purged with the aid of an inactive gas (e.g. nitrogen or argon) and/or evacuated between reactant pulses to remove surplus gaseous reactants and reaction by-products from the chamber.

An extensive description of ALD precursors and ALD-grown materials has been presented by Prof. M. Ritala and Prof M. Leskela in a recent review article, Handbook of Thin Film Materials, Vol. 1: Deposition and Processing of Thin Films, Chapter 2 "Atomic Layer Deposition", pp. 103-159, Academic Press 2002, incorporated by reference herein.

In context of the present embodiments "a reaction space" designates generally a reaction chamber, or a defined volume therein, in which the conditions can be adjusted so that deposition of a thin film is possible.

In the context of the present embodiments, "an ALD type reactor" is a reactor where the reaction space is in fluid communication with an inactive gas source and at least one, preferably at least two precursor sources such that the precursors can be pulsed into the reaction space. The reaction space is also preferably in fluid communication with a vacuum generator (e.g. a vacuum pump), and the temperature and pressure of the reaction space and the flow rates of gases can be adjusted to a range that makes it possible to grow thin films by ALD type processes.

There are a number of variations of the basic ALD method, including PEALD (plasma enhanced ALD) in which plasma is used for activating reactants. Conventional ALD or thermal ALD refers to an ALD method where plasma is not used but where the substrate temperature is high enough for overcoming the energy barrier (activation energy) during collisions between the chemisorbed species on the surface and reactant molecules in the gas phase so that up to a molecular layer of thin film grows on the substrate surface during each ALD pulsing sequence or cycle. For the purpose of the present embodiments and examples the term "ALD" covers both PEALD and thermal ALD.

"Metal source material" and "metal precursor" are used interchangeably to designate a volatile or gaseous metal compound that can be used in an ALD process. Preferred metal source materials and metal precursors can be used as a starting compound for the corresponding metal oxide.

The term "multi-component thin film" covers all thin film materials, for example, oxide, nitride, boride, carbide or sulphide materials comprising at least two different metal cations. The term "multi-component oxide" covers oxide materials comprising at least two different metal cations.

According to an embodiment, titanium oxide containing thin films are deposited by ALD using titanium alkoxide precursors as a first metal precursor, more preferably the specific alkoxide precursor $Ti(OMe)_4$.

In an example ALD type oxide process, a gas phase pulse of an evaporated first metal precursor compound is introduced into the reaction space of an ALD reactor where it is contacted with a suitable substrate. No more than a monolayer, or substantially a monolayer, of the first metal precursor compound adsorbs to the substrate surface in a self-limiting manner. Excess first metal precursor is removed from the reaction space by purging and/or evacuating the chamber.

Subsequently, a gas phase pulse of an oxygen source material is introduced into the reaction space where it reacts with the adsorbed first metal precursor in a self-limiting manner. The oxygen source material is preferably selected from the group comprising or consisting of water, oxygen, oxygen containing plasma, oxygen atoms, hydrogen peroxide, aqueous solution of hydrogen peroxide, ozone, oxides of nitrogen, halide-oxygen compounds, peracids (—O—O—H), alcohols, alkoxides, oxygen-containing radicals and mixtures thereof. Ozone is preferred as the oxygen source material in many applications as it does not contain hydrogen atoms and thus do not form hydroxides directly with the alkaline earth materials, unless the alkaline earth material contains hydrogen atoms, in which case the hydroxide may still form during the combustion type reaction between ozone and the hydrogen containing material.

By alternating the provision of the first metal precursor and the oxygen source material, a metal oxide thin film can be deposited.

Optionally, an inactive gas can be used as a carrier gas during deposition. Inactive gas may also be used to purge the reaction chamber of excess reactant and reaction by-products, if any, between reactant pulses.

The deposition can be carried out at normal pressure, but it is preferred to operate the process at reduced pressure. Thus, the pressure in the reactor is typically 0.01-20 mbar, preferably 0.1-5 mbar.

The reaction temperature can be varied depending on the evaporation temperature and the decomposition temperature of the precursor. In some embodiments the range is from about 100 to 400° C., in particular about 100 to 350° C. The substrate temperature is preferably low enough to keep the bonds between thin film atoms intact and to prevent thermal decomposition of the gaseous reactants. On the other hand, the substrate temperature is preferably high enough to keep the source materials in gaseous phase and avoid condensation. Further, the temperature is preferably sufficiently high to provide the activation energy for the surface reaction. In preferred embodiments the deposition temperature is preferably between about 100 and about 300° C.

For further details on the operation of a typical ALD process, reference is made to the documents cited above.

The substrate can be of various types. Examples include, without limitation, silicon, silica, coated silicon, germanium, silicon-germanium alloys, copper metal, noble and platinum metals group including silver, gold, platinum, palladium, rhodium, iridium and ruthenium, nitrides, such as transition metal nitrides, e.g. tantalum nitride TaN, carbides, such as transition metal carbides, e.g. tungsten carbide WC, and nitride carbides, e.g. tungsten nitride carbide $WN_xC_y$. The preceding thin film layer deposited on the substrate, if any, will form the substrate surface for the next thin film.

In order to produce multi-component oxide films, a second metal source material can be introduced to the ALD process. Additional metal source materials can also be used, depending on the number of metals desired in the thin film. For example, in some embodiments, a third, fourth, fifth etc. . . . metal compound is used. According to certain examples, each additional metal source material is provided in a separate cycle, with each cycle comprising feeding a vapor phase pulse of a metal source material, removing excess metal source material, providing a vapor phase pulse of an oxygen source material and removing excess oxygen source material. The same oxygen source material may be provided after each metal reactant, or different oxidants may be used to oxidize the different metals. The number of cycles for each metal precursor may be approximately equivalent or may be different, depending on the composition of the film that is desired.

According to certain examples, a pulse of the second metal source reactant is the next reactant provided after a titanium source material in the same deposition cycle. An oxidant is then provided to convert the two metals to oxides. Additional metal reactants may also be provided prior to provision of the oxygen containing source material. Furthermore, an oxidant can be provided after each metal source reactant, as discussed above.

In addition, the second (or additional) metal compound can be provided in each ALD cycle. That is, a pulse of the second metal compound can be provided for each pulse of the first metal reactant. However, the second metal reactant can also be provided intermittently in the deposition process. Still yet, a nanolaminate structure can be deposited by repeating a first cycle comprising provision of the first metal precursor and a first oxidant to deposit a thin film of first metal oxide, followed by repeating a second cycle comprising provision of the second metal precursor to deposit a thin film of the second metal oxide. The nanolaminate can start and end with either metal, and the thickness of each layer can be determined by the skilled artisan based on the particular circumstances.

Additional metal precursors can be metal compounds comprising a single metal or complex metal compounds comprising two or more metals. The metal compounds are preferably selected from the group of volatile or gaseous compounds of transition metals and main group metals, i.e., elements of groups 1, 2, 3, 4, 5, 6, 7, 8, 9, 10, 11, 12, 13 and/or 14 (according to the system recommended by IUPAC) in the periodic table of elements.

Since properties of the metal compounds vary, the suitability of each metal compound for use in an ALD processes disclosed herein should be considered. The properties of the compounds can be found, e.g., in N. N. Greenwood and A. Earnshaw, Chemistry of the Elements, 1.sup.st edition, Pergamon Press, 1986. The suitability of any particular compound can readily be determined by a skilled artisan.

According to certain examples, preferred first metal source materials are halides, preferably fluorides, chlorides, bromides or iodides, or metal organic compounds, preferably alkyl, alkoxy, alkylamino, alkylsilyl, alkylsilylamino, cyclopentadienyl, dithiocarbamate or betadiketonate or derivative compounds of the desired metal(s) thereof. Preferred first metals include Ti, Zr, Hf, Ta, Nb, Al. Additionally, double metal precursors, i.e. molecules containing two metals in a discrete ratio, may be used.

According to certain examples, preferred second metal source materials are halides, preferably fluorides, chlorides, bromides or iodides, or metal organic compounds, preferably alkyl, alkoxy, alkylamino, alkylsilyl, alkylsilylamino, cyclopentadienyl, dithiocarbamate or betadiketonate or derivative compounds of the desired metal(s) thereof. Preferred second metals include Bi, Pb, Nb, Sr or Ba. Additionally, double metal precursors, i.e. molecules containing two metals in a discrete ratio, may be used. In particular examples, cyclopentadienyl barium and/or cyclopentadienyl strontium compounds are used.

In certain examples preferred third or fourth metal source material are chosen from those described above in accordance with the first and second metal source materials.

According to certain examples, barium, strontium, lanthanum and zirconium are used as sources of a second and/or third and/or fourth etc. . . . metal in ternary and other multi-component oxides. As mentioned above, the second metal source material (and any additional metal reactants) can be oxidized using the same or another oxygen source material as for a titanium precursor.

In a particular example, a multi-component oxide thin film comprises barium, strontium and titanium. The multi-component oxide film may be barium-strontium titanate, strontium titanate or barium titanate. The multi-component oxide is preferably deposited by alternating three deposition cycles, as described above. Thus, in one deposition cycle a vapour phase reactant pulse comprising a first metal compound, preferably a titanium alkoxide compound, and more preferably a titanium methoxide compound, is fed into the reaction chamber. Excess first metal compound and reaction by products, if any, are removed from the reaction chamber, preferably with the aid of an inert gas. An oxygen source material, preferably ozone, is then provided to the reaction chamber where it reacts with the chemisorbed first metal compound. In the second cycle a second metal compound, preferably a cyclopentadienyl compound, is provided in the reactant pulse. In the third cycle a third metal compound, preferably a cyclopentadienyl compound different for the second metal compound, is provided in the reactant pulse. The three cycles may be provided in any order, and the deposition may begin and end with any of the cycles. In addition, one ratio of the cycles may be varied to provide the desired composition, as can be determined by the skilled artisan.

In theory, a stoichiometric oxide $ABO_3$ can be obtained simply by pulsing the two metal precursors and corresponding oxygen sources alternately and the growth rate of the ternary oxide can be predicted by summing the growth rates of the constituent oxides. In practice, however, both growth rate assumptions often fail due to the different reactivities of the precursors. The effect of surface chemistry usually causes changes in relative growth rate, which can be determined by comparing the observed film thickness with the theoretical thickness calculated from the growth rates of binary oxides.

The thin film oxide deposition processes described herein will find extensive application in the fields of semiconductors, insulators and ferroelectrics. In addition, other applications will be apparent to the skilled artisan.

Multi-component oxide materials are used, for example, in memory technology. $BaTiO_x$ and $SrTiO_x$ are interesting ultra high-k materials. ALD deposition of these ternary oxides is difficult.

Alkaline earth metals, like barium and strontium, are very eager to form hydroxides when in contact with water. BaO for example is used as a drying agent, it easily adsorbs water during ALD deposition of BaO when water is used as the oxygen source. Other oxygen sources, like ozone, may cause other problems as barium also absorbs $CO_2$ forming a very stable $BaCO_3$. SrO is also very hygroscopic, and there is also a risk of forming a stable carbonate if ozone is used in oxide deposition.

As multi-component oxides are deposited by repeating binary oxide reaction cycles (in the following example illustrated as in cases of BaO, SrO and $TiO_2$), a way to avoid problems caused by the specific nature of barium and strontium oxides must be found. One way is to mix these binary oxide reaction cycles as thoroughly as possible. The composition of the films can be adjusted by changing the ratio of these binary oxide reaction cycles. In case of another metals, were there might be similar problems, mixing the binary reaction cycles as thoroughly as possible may help.

Typically, oxide films comprising a first metal A and oxygen O are deposited by ALD by pulsing a precursor containing the first metal A, optionally purging with an inert gas, then supplying O and optionally purging with an inert gas. This is called an A+O deposition cycle.

Typically, oxide films comprising a second metal B and oxygen O are deposited by ALD by pulsing a precursor containing the second metal B, optionally purging with an inert gas, then supplying O and optionally purging with an inert gas. This is called a B+O deposition cycle. B is an illustrating a second metal, not to be confused to be limited only to boron which symbol is B.

Typically, oxide films comprising a third or fourth metal, C or D, and oxygen O are deposited by ALD by pulsing a precursor containing the third or fourth metal, C or D, optionally purging with an inert gas, then supplying O and optionally purging with an inert gas. This is called a C+O or a D+O deposition cycle. C and D are illustrating third or fourth metals, not to be confused to be limited only to carbon which symbol is C or to deuterium which symbol is D.

These A+O, B+O, C+O and/or D+O deposition cycles can be mixed to achieve desired end results for multi-component oxide film having, for example, a cycling ratio X:Y, where X represent cycles for A+O and Y represent cycles for B+O. Similarly in a cycling ratio X:Y:Z for multi-component film comprising A+O, B+O and C+O deposition cycles, X represent cycles for A+O, Y represent cycles for B+O and Z represent cycles for C+O. Similarly in cycling ratio X:Y:Z:W for multi-component film comprising A+O, B+O, C+O and D+O deposition cycles, X represent cycles for A+O, Y represent cycles for B+O, Z represent cycles for C+O and W represent cycles for D+O. Similarly, the example can be extended to a greater number of components.

An A-B-O Multi-component oxide film comprising a first metal A, a second metal B and an oxygen O is sometimes desired to be deposited with cycling ratios where each metal is desired to be deposited in more than one cycle to achieve desired ratios, i.e cycling ratios X:Y, wherein both X and Y are equal to or more than 2. In some cases there is also an additional metal C, metal D etc. and correspondingly X:Y:Z:V etc. wherein all X, Y, Z, W ... etc are equal or more than 2. In these cases it is desirable to achieve thorough mixing of the materials by breaking down the cycle ratios.

For example, if deposition a process comprising $$n \times [x \times (A+O) + y \times (B+O)], \quad (1)$$

wherein n is the total number of cycles, x is the number of subcycles for the first metal oxide film, y is the number of subcycles for the second metal oxide film, A is the first metal precursor, O is the oxygen precursor and B is the second metal precursor, is desired to be deposited with cycling rations where both x and y are more than 2, for example x:y ratios of 3:2; 5:3, it is desirable to breakdown the subcycles to achieve thorough mixing. For example when, $n \times [3 \times (A+O) + 2 \times (B+O)]$ or $n \times [5 \times (A+O) + 3 \times (B+O)]$ cycling is undesirable.

It is desirable to breakdown the cycles for total cycling ratio x:y of deposition process according to formula (1) to smaller subcycles:

$$n \times \{k \times [(A+O)+(B+O)] + [m \times (A+O)] + [w \times (B+O)]\}, \quad (2)$$

wherein n is total the number of cycles, k is the number of subcycles with 1:1 ratio, for example to achieve through mixing, m is the number of additional subcycles for the first metal oxide film, w is the number of additional subcycles for the second metal oxide film, A is the first metal precursor, O is the oxygen precursor and B is the second metal precursor and wherein the selected total cycling ratio x:y is achieved by choosing x=k+m and y=k+w.

For example in case of 3:2 or 5:3 cycling ratios it is desirable to breakdown subcycle repetitions to smaller sections to achieve thorough mixing:

$$n \times [3 \times (A+O) + 2 \times (B+O)] \text{ (total cycling ratio 3:2)}$$

$$n \times [5 \times (A+O) + 3 \times (B+O)] \text{ (total cycling ratio 5:3)}$$

should be broke down to smaller subcycle orders, for example:

$$n \times \{2 \times [(A+O)+(B+O)] + 1 \times (A+O)\} \text{ or (total cycling ratio 3:2)}$$

$$n \times \{3 \times [(A+O)+(B+O)] + 2 \times (A+O)\} \text{ (total cycling ratio 5:3)}$$

Cycling ratio 3:2 could alternatively be:

$$n \times \{1 \times (A+O) + 2 \times [(A+O)+(B+O)]\} \text{ or}$$

$$n \times \{(A+O)+(B+O)+(A+O)+(A+O)+(B+O)\}$$

Skilled artisan can understand that the additional subcycles m and w of the formula 2 can be positioned anywhere in the total deposition cycle.

Generally, the concept of breaking down the total deposition cycle to smaller subcycles to achieve thorough mixing can be realised by doing 1:1 subcycles as much as possible and then adding the needed amount additional subcycles at any point within the deposition cycle to realize the total desired total cycling ratio.

In an example, when depositing A-B-O comprising multi-component films by ALD by mixing two individual metal oxides deposition cycles A+O and B+O the subcycle order is selected in such way that as few as possible consecutive deposition subcycles for A+O or B+O is performed.

In an example, when depositing A-B-O comprising multi-component films by ALD by mixing two individual metal oxide deposition subcycles with total cycle ratio x:y where x represents the subcycle numbers A+O and where y represents the subcycle numbers for B+O and where both x and y are equal to 2 or more, the subcycles for each material deposition subcycle is divided into as many 1:1 cycling ratios, i.e. as many as possible (A+O+B+O) cycles, as possible and the leftover subcycles are added at one or more points within the total deposition cycle in order to achieve the desired total cycling ratio.

In an example, when depositing A-B-O comprising multi-component films by ALD by mixing two individual metal oxide deposition subcycles with total cycle ratio x:y where x represents the subcycle numbers A+O and where y represents the subcycle numbers for B+O and where both x and y are equal to 2 or more, the subcycles for each material deposition subcycle are divided into as many 1:1 cycling ratios and 2:1 or 1:2 cycling ratios, i.e. as many as possible (A+O+B+O) cycles and [2×(A+O)+B+O)] or [A+O+2×(B+O)] cycles as possible, and the leftover subcycles are added at one or more points within the total deposition cycle in order to achieve the desired total cycling ratio.

In an example, when depositing A-B-C-O comprising multi-component films by ALD by mixing three individual metal oxide deposition subcycles with total cycle ratio x:y:z where x represents the subcycle numbers A+O, where y represents the subcycle numbers B+O, where z represents the subcycle numbers C+O and where both x and y are equal to 2 or more, and z is equal to 1 or more, the subcycles for each material deposition subcycle are divided into as many 1:1:1 cycling ratios, i.e. as many as possible (A+O+B+O+C+O) cycles, and the leftover subcycles are added at one or more points within the total deposition cycle in order to achieve desired total cycling ratio.

In the examples listed above, the leftover subcycles may be added at one or more points within the total deposition cycle. According to certain further examples, the position of the leftover subcycle, the order and/or the placement of the precursor pulse pairs are specifically chosen to reduce unnecessarily repetitive same precursor pulses. This ordering and placement may also take in to account the following cycle order.

For example, when depositing A-B-O comprising multi-component films by ALD having a pulse ration of component precursors A+O and B+O of 5:3 (simplified as A and B), the subcycles are first divided in to as many 1:1 pairs as possible (in the present example 3, 1:1 AB pairs) leaving 2 leftover A subcycles. While the 2 leftover A subcycles may be simply added behind the 3 AB pairs, leaving a single cycle of ABABABAA (therefore having a maximum of only 2 repetitive A cycles), the result of two back to back cycles would produce the series ABABABAAABABABAA which includes a block of three consecutive A subcycles.

This repetition can be easily avoided by properly spacing the two leftover A subcycles. For example, a single cycle can be created as follows: ABAABAAB. Therefore, the result of two consecutive cycles is ABAABAABABAABAAB, wherein the maximum consecutive precursor subcycles is limited to two.

A method according to an embodiment of the present invention for depositing a multi-component oxide film by an ALD process can be summarized as follows. The method being for a multi-component oxide film having components A-B-O, wherein A is a first metal precursor, B is a second metal precursor, more specifically where the second precursor is distinct from the first, and O is an oxygen source material, and where the method for depositing the multi-component oxide film includes depositing an uneven simplified ratio of X(A+O) to Y(B+O) metal oxide deposition cycles. The uneven simplified ratio being, for example, a simplified ratio of 3:2 or 5:3. Additionally, for example, in an SrTiOx multi-component oxide film, the first metal precursor may be either Sr or Ti and the other component is the second metal precursor. In such an example, taking Sr as the first metal precursor A and Ti as the second metal precursor B, the first and second metal oxide deposition cycles would comprise, e.g. SrO (A+O) and TiO$_2$ (B+O).

The method according to the present embodiment comprises the steps of pulsing (A+O) followed by (B+O) the lesser of X and Y times, and pulsing the remaining number of first or second metal oxide deposition cycles before and/or after one or more of said (A+O) and (B+O) pairs such that neither the first nor the second metal oxide deposition cycle is repeated more than |X−Y| times. The plurality of first and second metal oxide deposition cycles X+Y equals a single total deposition cycle and the method may further comprise the step of depositing a plurality of total deposition cycles until a multi-component oxide film having a desired thickness is produced.

For an example where the uneven simplified ratio of SrO (A+O) to TiO$_2$ (B+O) is 5(X) to 3 (Y), then the method comprises the step of pulsing the combination of SrO followed by TiO$_2$ 3 times (i.e. Y=3 which is less than 5=X) and then pulsing the remaining 2 SrO metal oxide deposition cycles before and/or after one or more of the SrO/TiO$_2$ pairs such that neither SrO nor TiO$_2$ are repeated more than 2 (i.e. 5−3) times. The possible set of cycles can then be simplified as, for example, one of the following (not limited to); ABAABAAB, ABAABABA, ABAABAAB, ABABAABA, ABABABAA, AABABAAB, AABABAB, AABAABAB, BAABAABA, BABAABAA, etc.

Furthermore, the arrangement of the leftover pulses can take in to consideration the beginning of the following cycle, i.e. the beginning of the total deposition cycle, so that when two total deposition cycles are performed back to back that the resulting set of pulses would not repeat either the first or second metal oxide deposition cycle more that the absolute value of |X−Y| times. For the example above, the 2 leftover SrO cycles would not be arranged to form, for example, the following total deposition cycle, ABABABAA, as the result of two total deposition cycles would be ABABABAAABABABAA, resulting in a total of three SrO, A, metal oxide deposition cycles in a row.

The following non-limiting example illustrates an implementation of the present invention.

The following are examples for deposition of strontium or barium and titanium (i.e. SrTiO$_x$ (STO) or BaTiO$_x$ (BTO)) containing multi-component oxide films:

EXAMPLE

The growth of SrO on a TiO$_2$ surface and the growth of TiO$_2$ on a SrO surface has been studied with LEIS (Low Energy Ion Scattering).

When multiple SrO deposition cycles are repeated on a TiO$_2$ starting surface, the surfaces fraction of SrO does not increase linearly with the number of repeated SrO cycles, as is shown for example in FIG. 1. This could be supported by results from deposition tests where more than one subsequent SrO cycles are applied in deposition of SrTiOx, as shown for example in FIG. 2.

Figure 2:
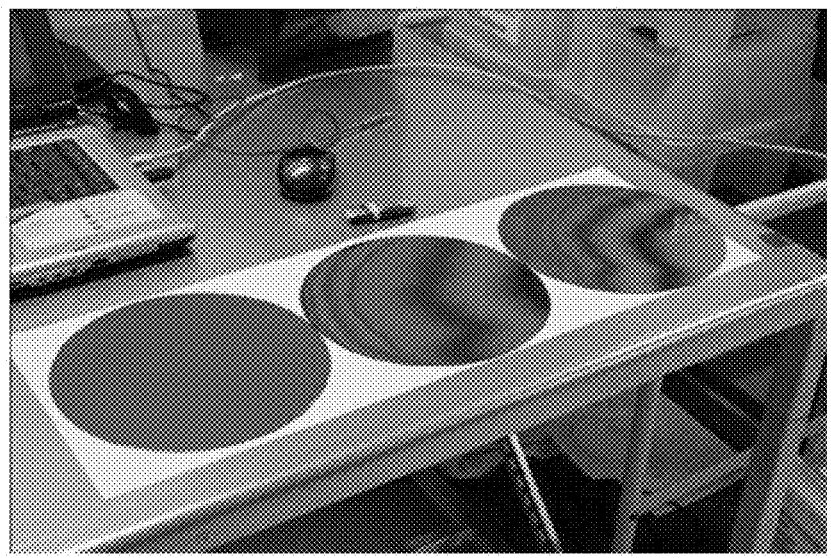
FIG. 2 shows example samples of deposition using pulsing sequences of SrO to $TiO_2$ of 1:1 (Left), 2:1 (Center), 3:1 (Right).

The samples made with two or three consecutive SrO deposition cycles were already visually very non-uniform. In FIG. 2, the left most film was created using a pulse ratio of SrO to TiO$_2$ of 1:1. As can be seen by the figure, the film is visually uniform. The central film was created using a pulse ratio of SrO to TiO$_2$ of 2:1. As can be seen by the figure, the film is visually non-uniform. The non-uniformity of the film increased further in the third, right most film when the pulse ratio of SrO to TiO$_2$ was 3:1.

Figure 3:
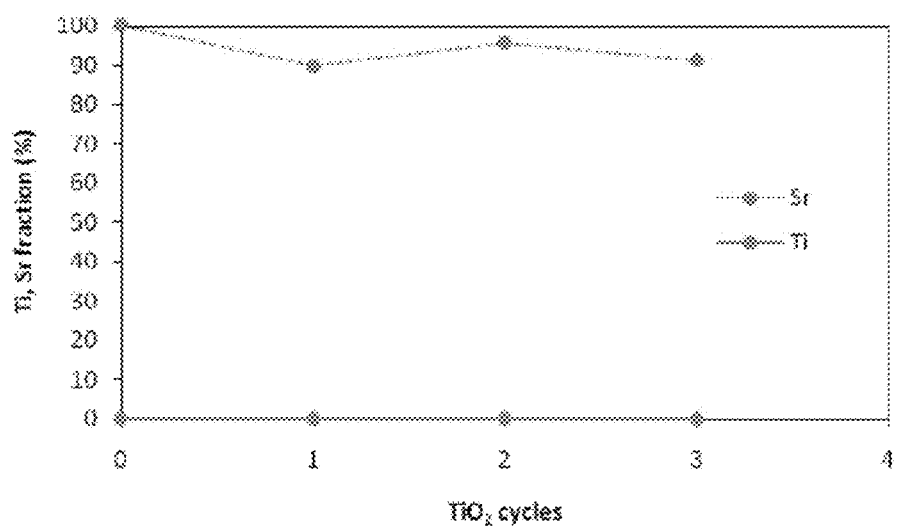
FIG. 3 shows $TiO_2$ deposited on an SrO starting surface. Ti (solid line) and Sr (dashed line) surface fraction % for growth of $TiO_2$ on 100 cycles of SrO is graphed.

When TiO₂ is deposited on an SrO starting surface, the Ti diffuses into the layer forming SrTiOx, as shown for example in FIG. 3, which is the preferred film material.

Thus when depositing films with pulsing ratio 2:3 the deposition subcycles were mixed as much as possible (acronyms Ti and Ba/Sr are used instead of Ti precursor and Ba/Sr precursor).

{1[(Ti+water)+1(Ba/Sr+water)]+1[1(Ti+water)+2(Ba/Sr+water)]}×number of cycles instead of {2(Ti+water)+3(Ba/Sr+water)}×number of cycles Thus when depositing films with pulsing ratio 5:3 the deposition subcycles were mixed as much as possible (acronyms Ti and Ba/Sr are used instead of Ti precursor and Ba/Sr precursor)

{1[(Ti+water)+1(Ba/Sr+water)]+2[1(Ti+water)+2(Ba/Sr+water)]}×number of cycles instead of {3(Ti+water)+5(Ba/Sr+water)}×number of cycles In both cases with total cycle ratios 2:3 and 5:3 and with subcycles mixed as much as possible as shown above, very uniform films were achieved as opposed what would have been achieved if the subcycles wouldn't have been mixed.

For purposes of summarizing embodiments and examples of the invention and some of the advantages achieved over the prior art, certain objects and advantages have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein. All of these embodiments are intended to be within the scope of the invention herein disclosed.

The invention claimed is:

1. A method for depositing a multi-component oxide film by an Atomic Layer Deposition (ALD) process, said multi-component oxide film having components A–B–O, wherein
    A is a first metal precursor,
    B is a second metal precursor distinct from the first, and
    O is an oxygen source material,
    said method comprising the steps of depositing a plurality of total deposition cycles until a desired thickness is produced, and
    wherein a first metal oxide deposition cycle is formed by pulsing A and then by supplying O and a second metal oxide deposition cycle is formed by pulsing B and then supplying O,
    wherein a total deposition cycle is formed by a series of first and second metal oxide deposition cycles,
    wherein a total deposition cycle includes an uneven simplified ratio of the first metal oxide deposition cycles to second metal oxide deposition cycles,
    and wherein the order of first and second metal oxide deposition cycles within the total deposition cycles is such that neither the first nor the second metal oxide deposition cycle is repeated consecutively more than a predefined number of times.

2. A method in accordance with claim 1, wherein said predefined number of times neither the first nor the second metal oxide deposition cycle is repeated is calculated as the next integer above the quotient of the greater of the number of first metal oxide deposition cycles and second metal oxide deposition cycles divided by the other.

3. A method in accordance with claim 1, wherein the metal oxide deposition cycle forming less of the total deposition cycle is never repeated when two total deposition cycles are performed sequentially.

4. A method in accordance with claim 1, wherein the ALD process is a Plasma Enhanced ALD (PEALD) process.

5. A method in accordance with claim 3, wherein there are at least 2 first and second metal oxide deposition cycles within the total deposition cycle.

6. A method in accordance with claim 5, wherein the multi-component oxide film contains at least one additional metal precursor component C, wherein a third metal oxide deposition cycle is formed by C+O, and wherein the third metal oxide deposition cycle is not repeated more than the predefined number of times.

7. A method in accordance with claim 6, wherein the total deposition cycle further includes, in a three part uneven simplified ratio to the first and second metal oxide deposition cycles, the third metal oxide deposition cycle, and
    neither of the two metal oxide deposition cycles associated with the lowest parts of the three part uneven simplified ratio are repeated within a single total deposition cycle.

8. A method for depositing a multi-component oxide film by an Atomic Layer Deposition (ALD) process,
    said multi-component oxide film having components A–B–O, wherein A is a first precursor, B is a second precursor distinct from the first, and O is an oxygen source material,
    wherein said method for depositing the multi-component oxide film includes depositing an uneven simplified ratio of X (A+O) to Y (B+O) first to second metal oxide deposition cycles, said method comprising the steps of;
    (i) pulsing the pair of (A+O) followed by (B+O) the lesser of X and Y times,
    (ii) pulsing the remaining number of first or second metal oxide deposition cycles before and/or after one or more of said (A+O) and (B+O) pairs such that neither the first nor the second metal oxide deposition cycle is repeated more than a predefined number of times,
    wherein steps (i) and (ii) form a single total deposition cycle, and
    (iii) depositing a plurality of total deposition cycles until a multi-component oxide film having a desired thickness is produced.

9. A method in accordance with claim 8, wherein said predefined number of times neither the first nor the second metal oxide deposition cycle is repeated is calculated as the absolute value of the difference of X and Y.

10. A method in accordance with claim 8, wherein said predefined number of times neither the first nor the second metal oxide deposition cycle is repeated is calculated as the next integer above the quotient of the greater of X and Y divided by the other.

11. A method in accordance with claim 8, wherein the placement of the remaining number of first or second metal oxide deposition cycles within the total deposition cycles is such that neither the first nor the second metal oxide deposition cycle is repeated more than the predefined number of times when two total deposition cycles are performed sequentially.

12. A method in accordance with claim 11, wherein said predefined number of times neither the first nor the second metal oxide deposition cycle is repeated is calculated as the next integer above the quotient of the greater of X and Y divided by the other.

13. A method in accordance with claim 11, wherein either the first or second metal oxide deposition cycle is pulsed first during a total deposition cycle.

14. A method in accordance with claim 8, wherein the metal oxide deposition cycle associated with the lesser of X and Y is never repeated within a total deposition cycle.

15. A method in accordance with claim 14, wherein the metal oxide deposition cycle associated with the lesser of X and Y is never repeated when two total deposition cycles are performed sequentially.

16. A method in accordance with claim 8, wherein A and B are selected from the group of; halides, metal organic compounds or derivative compounds of the desired metal(s).

17. A method in accordance with claim 8, wherein A or B is a titanium alkoxide compound and the other is a cyclopentadienyl compound containing either strontium or barium.

18. A method in accordance with claim 8, wherein the oxygen source material is different for precursor A and precursor B.

19. A method in accordance with claim 8, wherein the oxygen source material is ozone or water.

20. A method for depositing a multi-component oxide film by an Atomic Layer Deposition (ALD) process, said multi-component oxide film having components A–B–O, wherein A is a first metal precursor, B is a second metal precursor distinct from the first, and O is an oxygen source material, said method comprising the steps of depositing a ratio of X (A+O) to Y (B +O) first to second metal oxide deposition cycles in a series of deposition cycles to form total deposition cycles, each total deposition cycle having X+Y metal oxide deposition cycles, wherein the order of deposition cycles within the total deposition cycles is such that neither the first nor the second metal oxide deposition cycle is repeated consecutively more than a predefined number of times, and the ratio of X to Y is such that X does not equal Y.

* * * * *